United States Patent [19]

Miyake et al.

[11] Patent Number: 5,430,781
[45] Date of Patent: Jul. 4, 1995

[54] VARIABLE PULSE WIDTH GENERATOR CIRCUIT

[75] Inventors: Takashi Miyake; Nobusuke Abe, both of Itami, Japan

[73] Assignee: Mitsubishi Denki Kabushiki Kaisha, Tokyo, Japan

[21] Appl. No.: 128,968

[22] Filed: Sep. 30, 1993

[30] Foreign Application Priority Data

Oct. 7, 1992 [JP] Japan .................................. 4-268477

[51] Int. Cl.⁶ ........................ H03K 21/08; G06M 3/02
[52] U.S. Cl. .................................... 377/39; 377/56
[58] Field of Search ............................ 377/39, 56

[56] References Cited

U.S. PATENT DOCUMENTS

| | | | |
|---|---|---|---|
| 3,746,842 | 7/1973 | Fowler | 377/39 |
| 4,079,234 | 3/1978 | Kashio | 377/39 |
| 4,175,287 | 11/1979 | Fuhrman | 377/39 |
| 4,365,202 | 12/1982 | Sinniger | 377/39 |

*Primary Examiner*—John S. Heyman
*Attorney, Agent, or Firm*—Lowe, Price, LeBlanc & Becker

[57] ABSTRACT

A comparator is provided in the counter circuit to compare the counted value of clocks by a counter with the value of a register in which a target changing value of a comparison register which sets a value to be compared with the counted value of the counter is set. The value of the register is set in the comparison register when the counted value of the counter does not reach the set value of the register, whereas the value of the register is not set in the comparison register if the counted value does not reach the set value of the register, but the value of the comparison register is turned changeable at the desired timing while the counted value of the counter is being compared with the set value of the comparison register.

6 Claims, 5 Drawing Sheets

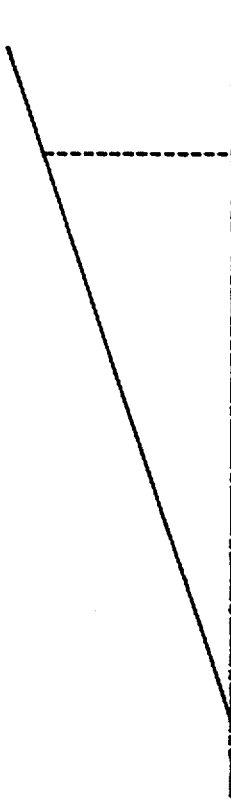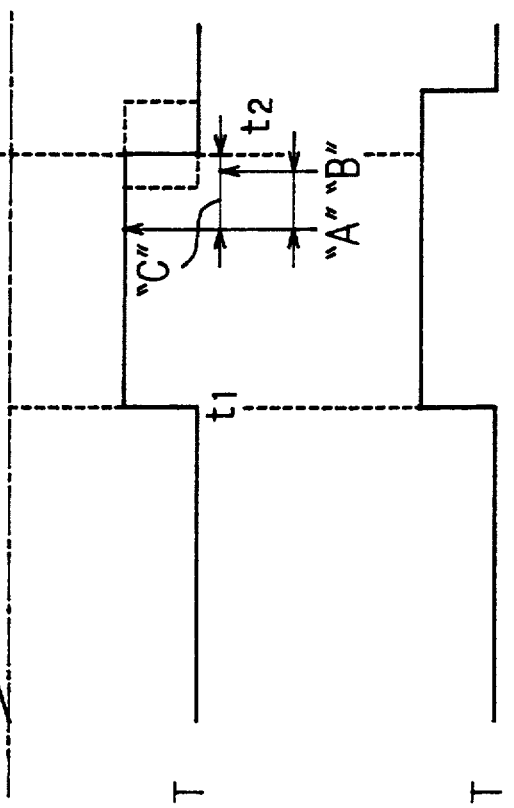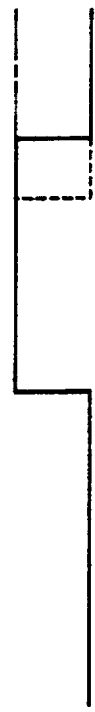
Fig. 2(a) Prior Art COUNTED VALUE
Fig. 2(b) Prior Art COUNTER CIRCUIT OUTPUT VALUE
Fig. 2(c) Prior Art COUNTER CIRCUIT OUTPUT VALUE
Fig. 2(d) Prior Art COUNTER CIRCUIT OUTPUT VALUE

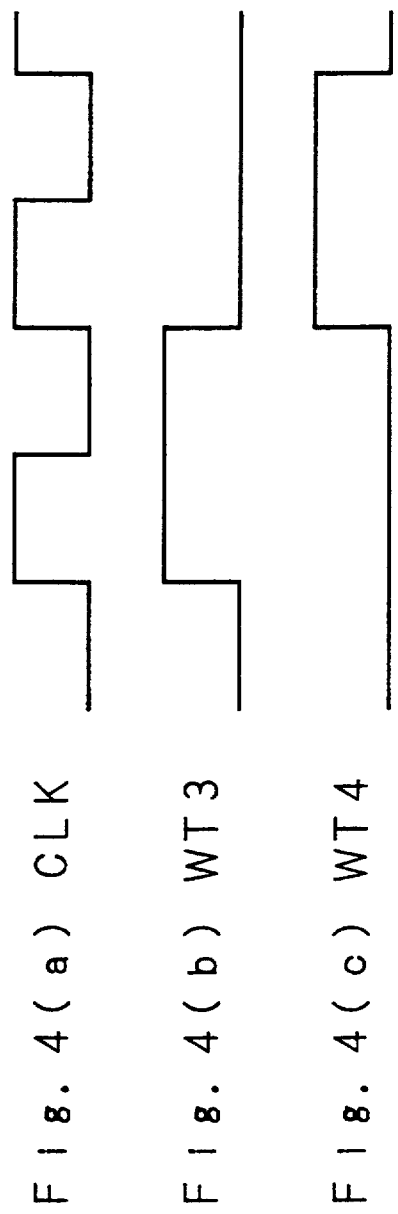
Fig. 4(a) CLK
Fig. 4(b) WT3
Fig. 4(c) WT4

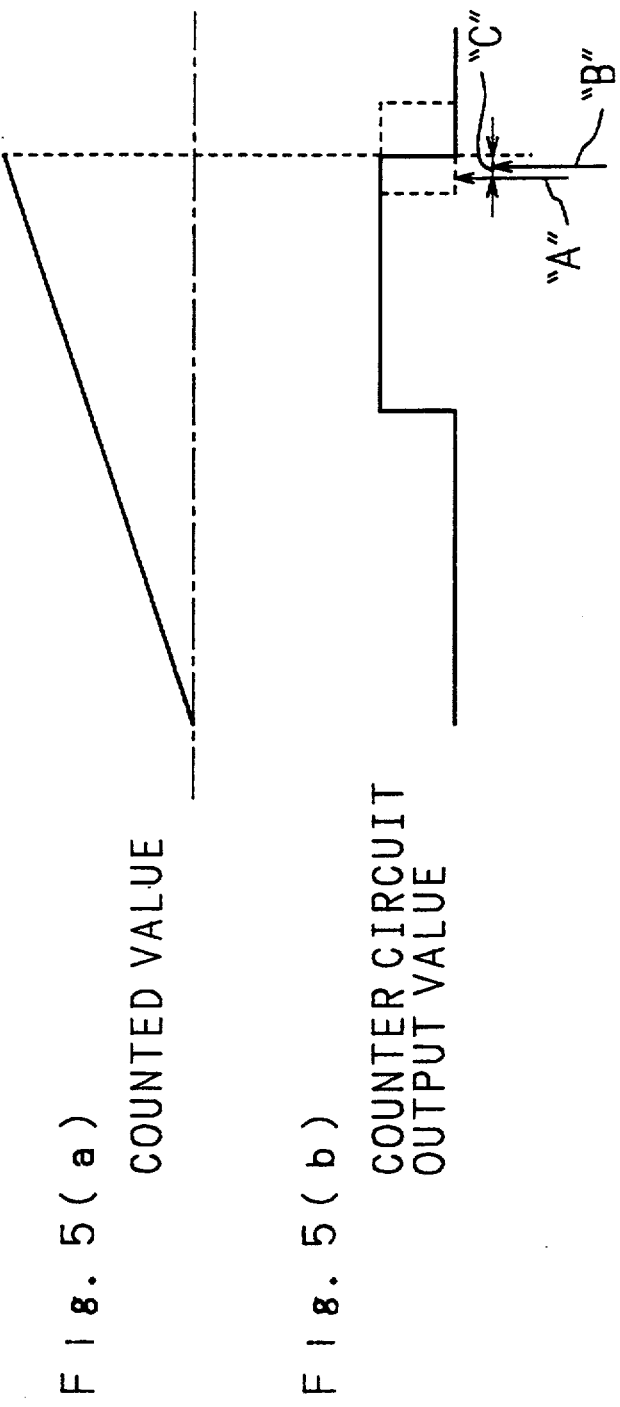

VARIABLE PULSE WIDTH GENERATOR CIRCUIT

BACKGROUND OF THE INVENTION

1. Field of the Invention

This invention relates to a circuit counter of an output comparing type.

2. Description of the Related Art

FIG. 1 is a block diagram showing the structure of a conventional output-comparing type counter circuit. In the counter circuit of FIG. 1, clocks CLK to be counted are inputted to a counter 1. Data is sent and received between the counter 1 and a bus BS. The counted value by the counter 1 and the set value of a comparison register 2 are fed to a comparator 3. A comparison signal CS outputted from the comparator 3 is sent to a gate terminal of a transfer gate TG1. When the transfer gate TG1 is closed upon receipt of the comparison signal CS, the value of a latch circuit 4 is given to a latch circuit 5 via the transfer gate TG1, whereby the latch circuit 5 outputs the value.

Write signals WT1, WT2 are sent to the gate terminals of a transfer gates TG2, TG3 respectively. In consequence, as the transfer gates TG2, TG3 are turned in the operable state, the data of the bus BS is transferred to the comparison register 2 via the transfer gate TG2 and to the latch circuit 4 via the transfer gate TG3, respectively.

The operation of the above-constructed conventional counter circuit will be depicted now.

The counter 1 continues to count up the clocks after it is enabled. In the first place, the counted value of the counter 1 which corresponds to the timing whereby the output value of the counter circuit is to be changed is set to the comparison register 2, and a target output value is set to the latch circuit 4. When the counted value of the counter 1 is detected to have reached the set value of the comparison register 2, the comparator 3 generates a comparison signal CS. Synchronously with this comparison signal CS, the transfer gate TG1 becomes operable, and the value of the latch circuit 4 is transferred to the latch circuit 5, and the value fed to the latch circuit 5 is outputted from the latch circuit 5, thereby to change the output value of the counter circuit.

In the manner as above, since the set value of the comparison register 2 corresponding to the timing whereby the output value of the counter circuit is to be changed and the set output value of the latch circuit 4 are sequentially changed, it enables the counter circuit to output the waveform of a desired time width. In order to change the set value of the comparison register 2, after a CPU (not shown) calculates a changed-to-be value, the CPU reads the current counted value of the counter 1, compares the counted value with the set value of the comparison register 2 to judge whether or not it is a changeable timing. Only when the timing is judged to be changeable, the value of the comparison register 2 is changed.

FIG. 2 is a diagram showing the change of the counted value of the counter 1 and the output value of the counter circuit. If the output waveform indicated in FIG. 2(b) is required, an "H" value is set to the latch circuit 4, an "L" value is set to the latch circuit 5 and the value at a time point t1 is set to the comparison register 2, when the counter 1 is activated. The counted value of the counter 1 increases as shown in FIG. 2(a).

At the time point T1 when the counted value of the counter 1 becomes the value of the comparison register 2, the comparator 3 generates the comparison signal CS and the "H" value of the latch circuit 4 is transferred to the latch circuit 5. Accordingly, as the value of the latch circuit 5 is changed from "L" to "H", the output waveform of the counter circuit rises as represented by a solid line in FIG. 2(b).

Corresponding to the generation of the comparison signal CS, and "L" value and the value at a time point t2 are set respectively to the latch circuit 4 and the comparison register 2, for example, at the occurrence of an interruption or the like. Thereafter, at the time point t2 when the counted value of the counter 1 reaches the value of the comparison register 2 again, the comparator 3 outputs the comparison signal CS, and the "L" value of the latch circuit 4 is transferred to the latch circuit 5. Since the value of the latch circuit 5 is changed from "H" to "L", the output waveform of the counter circuit falls as indicated by the solid line of FIG. 2(b). Subsequently, in accordance with the output of the comparison signal CS and consequent to the generation of an interruption or the like, an "H" value is set to the latch circuit 4 and the value of the next rise timing is set to the comparison register 2. The waveform of FIG. 2(b) is repeatedly obtained when the above sequence of control is repeated.

When the set value of the comparison register 2 is desired to be changed, as described above, the current counted value of the counter 1 should be read out after the changed-to-be value is calculated by the CPU, and the counted value should be compared with the set value of the comparison register 2 thereby to judge whether it is the timing able to be changed. Therefore, although it is enough to finish changing the output value of the counter circuit before the timing "B", the changed-to-be value should be completely calculated before the timing "A", as is clear from FIG. 2(b). In the case, for instance, where the counter circuit is used with an aim to control the engine, the time width "C" between the timings "A" and "B" which corresponds to the time required for the CPU to make a judgement is set considerably long, and therefore, the changed-to-be value cannot be calculated in time before the timing "A" even in need of the change. As a result, the value of the comparison register 2 is not changed in most cases.

Meanwhile, if the value of the comparison register 2 is arranged to be changed to a sufficiently larger value than the timing whereby it is expected that setting of the calculated change-to-be value to the comparison register 2 and the latch circuit 4 is completed, without making the CPU judge whether or not it is the changeable timing, any abnormal waveform is not particularly generated, and the waveform illustrated in FIG. 2(c) is obtained. If the comparison register 2 is changed to a smaller value, and if the timing whereby setting of the changed-to-be value is finished is the changeable timing prior to the set timing, the comparison signal CS is detected when the counted value of the counter 1 reaches the set value of the comparison register 2, so that the output waveform shown by a broken line is FIG. 2(d) which falls at a time point prior to the fall time point indicated by a solid line is obtained. On the other hand, however, if the timing whereby setting is finished is the timing subsequent to the set timing, the comparison signal CS is not obtained when the counter 1 assumes the changed-to-be value. As a result, as shown by a chain line in FIG. 2(d), the time width of the output waveform becomes abnormally long, without a fall.

As discussed hereinabove, when the once-set value of the comparison register is to be changed in the conventional counter circuit, it is necessary to judge by the CPU whether or not it is changeable before a changed-to-be value is calculated. Only a short time is left to finish the calculation of the changed-to-be value. It is impossible to calculate the changed-to-be value before time is up if a long time is allotted for the judgement by the CPU. The value of the comparison register cannot be eventually changed.

SUMMARY OF THE INVENTION

This invention has been devised to solve the aforementioned problems, and has for its object to provide a counter circuit which can afford a long time before a CPU completes calculation of a changed-to-be value, without requiring a judgement by the CPU whether or not a value of comparison register is possible to be changed.

The above and further objects and features of the invention will more fully be apparent from the following detailed description with accompanying drawings.

BRIEF DESCRIPTION OF THE DRAWINGS

FIGS. 2(a)-2(d) are diagrams showing the change of the counted value of a counter and the output value of the counter circuit of FIG. 1;

FIGS. 4(a)-(c) are timing charts of a clock signal and write signals, respectively; and FIGS. 5(a), 5(b) are diagrams showing the change of the counted value of a counter and the output value of the counter circuit of FIG. 3.

DESCRIPTION OF THE PREFERRED EMBODIMENTS

A preferred embodiment of this invention will be discussed in detail with reference to the accompanying drawings.

Figure 1:
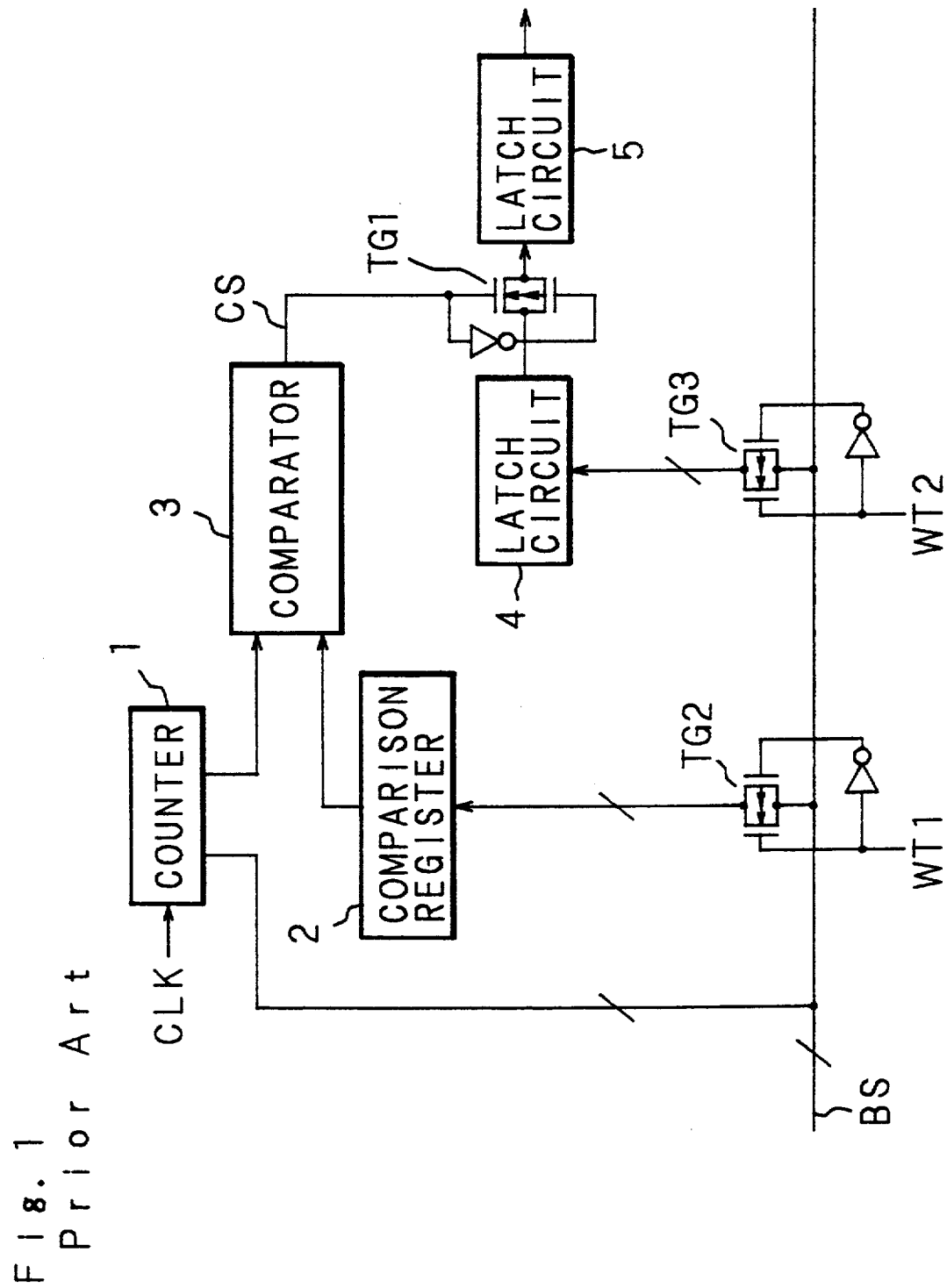
FIG. 1 is a block diagram showing the structure of a conventional counter circuit.
Figure 3:
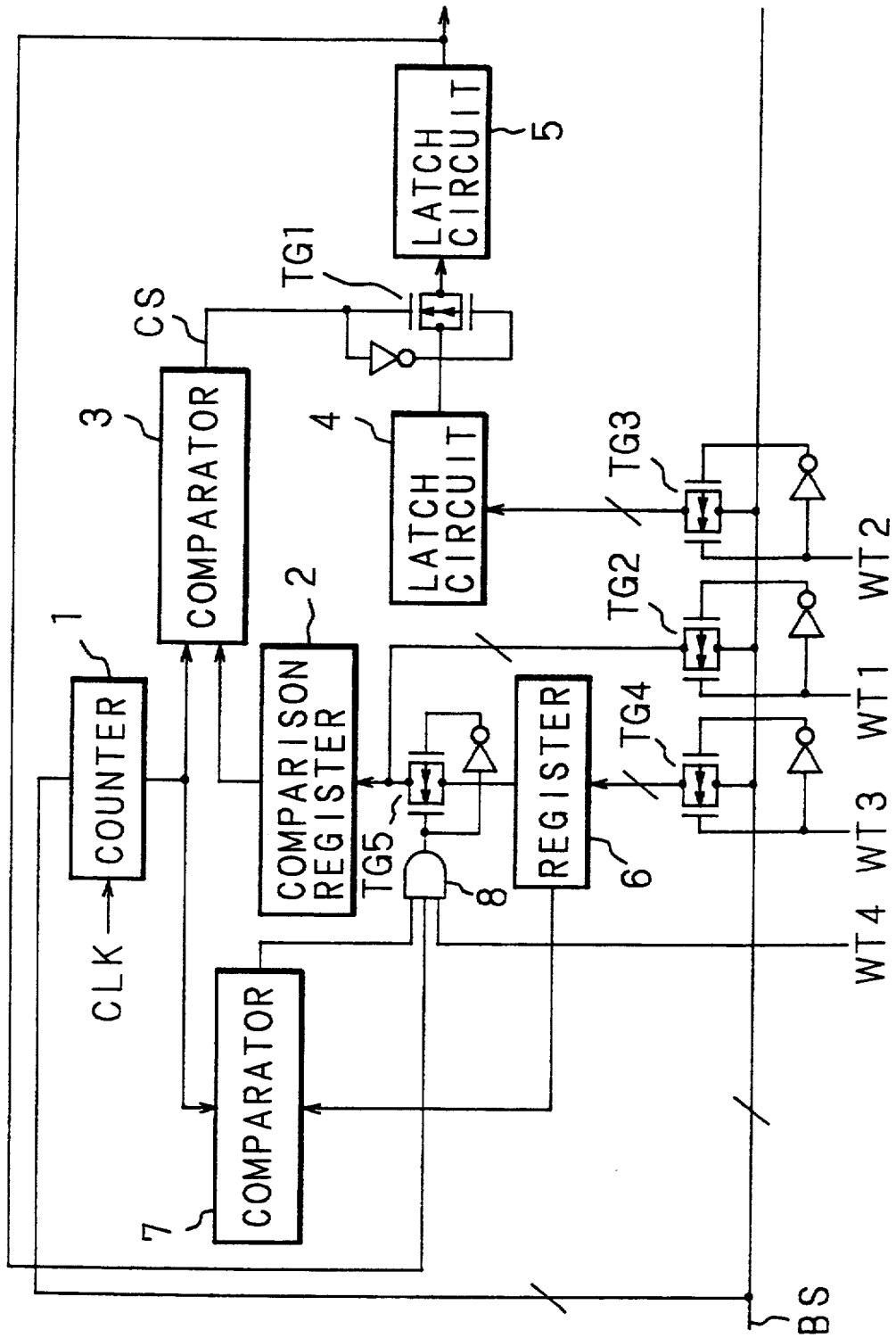
FIG. 3 is a block diagram showing the structure of a counter circuit according to this invention.

The structure of a counter circuit according to this invention is shown in a block diagram of FIG. 3. In FIG. 3, clocks CLK to be counted are inputted to a counter 1, and data is fed and received between the counter 1 and a bus BS. The counted value of the counter 1 and the set value of a comparison register 2 are supplied to a comparator 3. The counted value of the counter 1 is also supplied to a comparator 7.

A comparison signal CS generated from the comparator 3 is sent to a gate terminal of a transfer gate TG1. When the comparison signal CS is received, the transfer gate TG1 is closed, so that the value set in a latch circuit 4 is, via the transfer gate TG1, transferred to a latch circuit 5 which in turn outputs the supplied value. At the same time, the output value from the latch circuit 5 is inputted to a three-input AND circuit 8.

To gate terminals of transfer gates TG2, TG3, TG4 are inputted write signals WT1, WT2, WT3, respectively. The data in the bus BS is supplied to the comparison register 2 via the transfer gate TG2 as the transfer gate TG2 is closed operable in response to the write signal WT1, and likewise, to the latch circuit 4 via the transfer gate TG3 when the transfer gate TG3 is brought in the operable state by the write signal WT2. Moreover, when the transfer gate TG4 is closed by the write signal WT3, the data is sent to a register 6 via the transfer gate TG4. The set value in the register 6 is fed to the comparator 7 and also to the comparison register 2 via a transfer gate TG5. The output signal from the comparator 7 and a write signal WT4 which is a delay signal of the write signal WT3 are inputted to the three-input AND circuit 8.

The counter circuit of this invention in the above-described constitution operates in a manner as follows.

The counter 1 keeps counting up the clocks after it is enabled. The counted value of the counter 1 corresponding to the timing whereby the output of the counter circuit is to be changed is set to the comparison register 2, and moreover a target output value is set to the latch circuit 4. When the comparator 3 detects that the counted value of the counter 1 reaches the set value in the comparison register 2, the comparator 3 generates a comparison signal CS. The transfer gate TG1 is closed synchronously with the comparison signal CS, and accordingly the value of the latch circuit 4 is transferred to the latch circuit 5 and set in the latch circuit 5. The set value is outputted from the latch circuit 5, thereby to change the output value of the counter circuit.

As described hereinabove, since the value corresponding to the timing whereby the output value of the counter circuit is to be changed is set to the comparison resister 2 and the target output value is set to the latch circuit 4, and both set values are sequentially changed, the waveform of a desired time width can be outputted from the counter circuit.

More specifically, it will be described how the time width of the "H" level of the output waveform of the counter circuit is determined by changing the set value of the comparison register 2. A CPU (not shown) generates a write signal WT3 of FIG. 4(b) in synchronization with a clock signal CLK of FIG. 4(a) after it calculates a changed-to-be value, thereby closing the transfer gate TG4 and setting the changed-to-be value to the register 6. Further, the CPU generates a write signal WT4 at the timing of FIG. 4(c) subsequent to the write signal WT3 and inputs the signal to the three-input AND circuit 8. The comparator 7, comparing the counted value of the counter 1 with the set value in the register 6, outputs "H" to the three-input AND circuit 8 if the counted value does not reach the value of the register 6. If the output from the latch circuit 5 is "H", the logic of the three-input AND circuit 8 is satisfied and the output signal of the circuit 8 is fed to the transfer gate TG5. In consequence, the transfer gate TG5 is closed and the value of the register 6 is transferred to the comparison register 2, so that the value of the comparison register 2 is changed.

That is, if the counted value of the counter 1 does not reach the set value of the register 6 when the register 6 is set, the value of the comparison register 2 is changed. However, when the counted value of the counter 1 reaches the value of the register 6, the transfer gate TG5 is kept opened, and the value of the register 6 is not transferred, accordingly the value of the comparison register 2 is not changed.

The comparator 3 compares the counted value of the counter 1 with the changed set value of the comparison register 2. When the counted value reaches the set value, similar to the above, the value of the latch circuit 4 is transferred to the latch circuit 5, whereby the output value of the counter circuit is changed. In the manner as above, the time width of the "H" level of the output waveform of the counter circuit can be changed.

In the case where the time width of the "L" level of the output waveform of the counter circuit is to be changed, it can be done by inputting the value of the latch circuit 5 to the three-input AND circuit 8 via an inverter.

Accordingly, it is unnecessary for the CPU to read the values of the counter 1 and the comparison register 2 to detect whether or not it is changeable except for controlling the setting of the changed-to-be value to the register 6. Therefore, when the counted value reaches the value of the comparison register 2 as in FIG. 5(a), the output value of the counter circuit is changed as shown in FIG. 5(b). If the value of the comparison register 2 is to be changed, the timing "B" whereby the value of the comparison register 2 is actually changed is not different from that of the conventional counter circuit as shown in FIG. 5(b). However, the time width "C" required to determine whether or not the value can be changed to the changed-to-be value is reduced to nearly as a little as the time necessary for the comparator 7 to compare the counted value of the counter 1 with the set value of the register 6. Therefore, the timing "A" to complete the calculation of the changed-to-be value is delayed and the time width of the output waveform of the counter circuit is changed reliably.

Although the counter 1 in the embodiment is an up counter, the action of which was described, the same effect is achieved even when it is a down counter.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A variable pulse width generator circuit comprising:
    a counter for counting clock signals and for generating a counted value;
    a comparison register for storing a set value corresponding to a timing whereby an output value to the outside of said circuit is to be changed;
    a first comparator which compares the counted value of said counter with the set value of said comparison register and changes the output value to the outside of said circuit when said values coincide;
    a second register in which a value to be set to said comparison register is stored;
    a second comparator for comparing the set value of said second register with the counted value of said counter and for generating a logic signal allowing the change of the set value of said comparison register only when the counted value of said counter is smaller than the set value of said second register; and
    a gate circuit responsive to said logic signal for transferring the set value of said second register to said comparison register when said logic signal allowing the change of the set value is outputted from said second comparator, or does not transfer the set value of said second register to said comparison register when said logic signal allowing the change of the set value is not outputted from said second comparator.

2. A variable pulse width generator circuit comprising:
    a counter for counting clock signals and for generating a counted value;
    a comparison register for storing a set value corresponding to a change in one of a beginning and an end of a variable pulse width output waveform;
    a first comparator responsive to the counted value of said counter and to the set value of said comparison register for generating a first comparator output signal when said values coincide;
    a second register for storing a set value representing the set value for said comparison register;
    a second comparator for comparing the set value of said second register with the counted value of said counter and for generating a logic signal allowing the change of the set value of said comparison register;
    a gate circuit responsive to said logic signal for transferring the set value of said second register to said comparison register; and
    output means responsive to said first comparator output signal for providing said variable pulse width output waveform.

3. The pulse width generator circuit of claim 2, wherein said counter is an up-counter.

4. The pulse width generator circuit of claim 2, wherein said counter is a down-counter.

5. The pulse width generator circuit of claim 2 wherein said pulse width modulated signal is a high level of said output signal.

6. The pulse width generator circuit of claim 2 wherein said pulse width modulated signal is a low level of said output signal.

* * * * *